US 11,804,063 B2

(12) United States Patent
Tung et al.

(10) Patent No.: US 11,804,063 B2
(45) Date of Patent: Oct. 31, 2023

(54) PHOTOSENSITIVE APPARATUS

(71) Applicant: Au Optronics Corporation, Hsinchu (TW)

(72) Inventors: Tsu-Chien Tung, Hsinchu (TW); Chun-Hung Kuo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 224 days.

(21) Appl. No.: 17/368,735

(22) Filed: Jul. 6, 2021

(65) Prior Publication Data

US 2022/0050991 A1   Feb. 17, 2022

Related U.S. Application Data

(60) Provisional application No. 63/066,405, filed on Aug. 17, 2020.

(30) Foreign Application Priority Data

Mar. 30, 2021   (TW) .................................. 110111663

(51) Int. Cl.
  *G06V 40/13*   (2022.01)
  *H01L 27/146*   (2006.01)
(52) U.S. Cl.
  CPC .... *G06V 40/1318* (2022.01); *H01L 27/14623* (2013.01); *H01L 27/14627* (2013.01); *H01L 27/14678* (2013.01)

(58) Field of Classification Search
  CPC .......... G06V 40/1318; H01L 27/14623; H01L 27/14627; H01L 27/14678
  See application file for complete search history.

(56) References Cited

U.S. PATENT DOCUMENTS 9,690,971 B2   6/2017   Liao et al.
10,438,044 B2   10/2019   Wu et al.
11,329,096 B2   5/2022   Peng et al.
(Continued)

FOREIGN PATENT DOCUMENTS

CN   104135631   11/2014
CN   105390518   3/2016
(Continued)

*Primary Examiner* — Nelson Garces
(74) *Attorney, Agent, or Firm* — JCIPRNET

(57) ABSTRACT

A photosensitive apparatus includes an operating circuit, a first electrode, multiple first photosensitive patterns, a dielectric layer, a second electrode, a spacer layer, a light shielding layer, and at least one micro lens. The first electrode is electrically connected to a first terminal of the operating circuit. The first photosensitive patterns are separated from each other and disposed on the first electrode. Multiple first surfaces of the first photosensitive patterns are electrically connected to the first electrode. The dielectric layer is disposed on the first photosensitive patterns. The second electrode is disposed on the dielectric layer and electrically connected to multiple second surfaces of the first photosensitive patterns through multiple first contact holes of the dielectric layer. The spacer layer is disposed on the second electrode. The light shielding layer is disposed on the spacer layer. The at least one micro lens is disposed above the light shielding layer.

9 Claims, 7 Drawing Sheets

(56) References Cited

U.S. PATENT DOCUMENTS

2019/0026530 A1  1/2019  Wu et al.
2023/0178674 A1* 6/2023  Katsuta ................ H01L 31/105
                                                    257/414

FOREIGN PATENT DOCUMENTS

| CN | 106022324 | 10/2016 |
| CN | 109545804 | 3/2019 |
| CN | 110807421 | 2/2020 |
| CN | 111539392 | 8/2020 |
| CN | 211265482 | 8/2020 |

* cited by examiner

PHOTOSENSITIVE APPARATUS

CROSS-REFERENCE TO RELATED APPLICATION

This application claims the priority benefits of U.S. provisional application Ser. No. 63/066,405, filed on Aug. 17, 2020, and Taiwanese application no. 110111663, filed on Mar. 30, 2021. The entirety of each of the above-mentioned patent applications is hereby incorporated by reference herein and made a part of this specification.

BACKGROUND

Technical Field

The disclosure relates to a photosensitive apparatus.

Description of Related Art

Fingerprint may the best biometric password and exhibits uniqueness. With the maturation and popularization of equipment and identification technology, in addition to the access control for home protection, personal identification, identity verification at payment, or places requiring a high level of access control, in recent years, fingerprint sensing apparatuses have become more common in various mobile devices.

In a conventional fingerprint sensing apparatus, a backlight source is utilized as a sensor light source. Light beams emitted by the backlight source pass through a fingerprint sensor and reaches a finger. Since ridges and valleys of a fingerprint have different reflectivity, light beams reflected by the ridges and valleys of the fingerprint result in multiple photoelectric currents of different sizes on multiple sensor elements located at multiple places in the fingerprint sensor. Then, the sensor circuit reads out multiple sensing voltages of different sizes. Through the sensing voltages corresponding to multiple places in the fingerprint sensor, fingerprint image information may thus be obtained for fingerprint identification.

SUMMARY

The disclosure provides a photosensitive apparatus with improved performance.

In the disclosure, a photosensitive apparatus of includes a substrate, an operating circuit, a first electrode, a plurality of first photosensitive patterns, a dielectric layer, a second electrode, a spacer layer, a light shielding layer, and at least one micro lens. The operating circuit is disposed on the substrate and has a first terminal and a second terminal. The first electrode is disposed on the substrate and is electrically connected to the first terminal of the operating circuit. The first photosensitive patterns are separated from each other and are disposed on the first electrode. Each of the first photosensitive patterns has a first surface and a second surface, and the plurality of first surfaces of the first photosensitive patterns are electrically connected to the first electrode. The dielectric layer is disposed on the first photosensitive patterns and has a plurality of first contact holes. The second electrode is disposed on the dielectric layer and is electrically connected to the plurality of second surfaces of the first photosensitive patterns through the first contact holes of the dielectric layer. The spacer layer is disposed on the second electrode. The light shielding layer is disposed on the spacer layer and has a plurality of light transmission openings corresponding to the first photosensitive patterns. The at least one micro lens is disposed above the light shielding layer and is overlapped with the light transmission openings of the light shielding layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
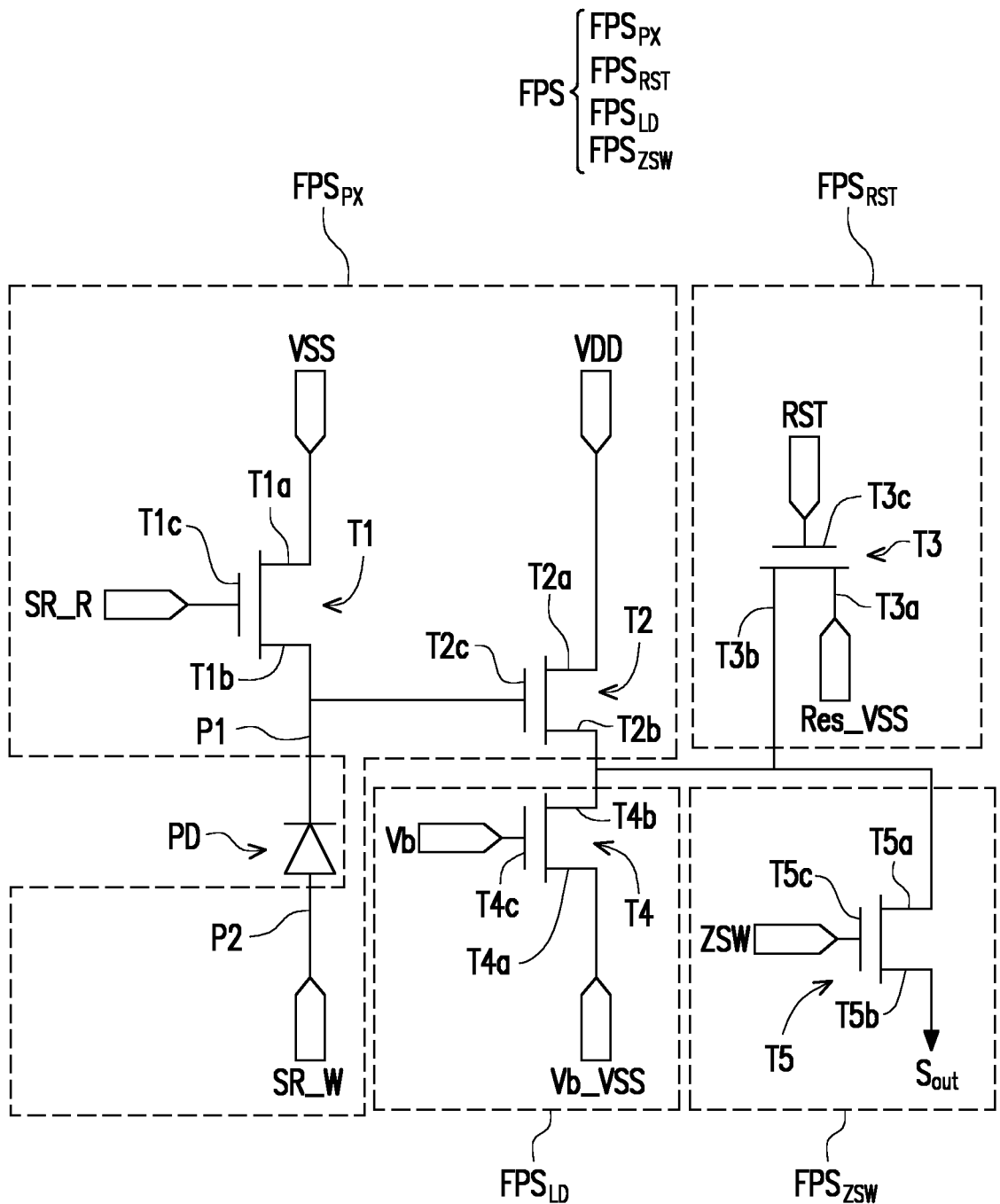
FIG. 1 is a schematic view of an equivalent circuit of a photosensitive apparatus 10 according to an embodiment of the disclosure.

Reference will now be made in detail to exemplary embodiments provided in the disclosure, examples of which are illustrated in the accompanying drawings. Wherever possible, identical reference numerals are used in the drawings and descriptions to denote identical or similar parts.

It should be understood that when an element such as a layer, film, region, or substrate is referred to as being "on", or "connected to" another element, it may be directly on or connected to the another element, or intermediate elements may also be present. In contrast, when an element is referred to as being "directly on" or "directly connected to" another element, no intermediate elements are present. As used herein, the term "connection" may refer to physical connection and/or electrical connection. Furthermore, "electrical connection" or "coupling" may encompass the presence of other elements between two elements.

The term "about", "approximately", or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For instance, "about" may mean within one or more standard deviations, or, for instance, ±30%, ±20%, ±10%, or ±5% of the stated value. Furthermore, a relatively acceptable range of deviation or standard deviation may be chosen for the term "about", "approximately", or "substantially" as used herein based on optical properties, etching properties, or other properties, instead of applying one standard deviation across all the properties.

Unless otherwise defined, all terms (including technical and scientific terms) used herein have the same meaning as commonly understood by people having ordinary skill in the art. It will be further understood that terms, such as those defined in commonly used dictionaries, should be interpreted as having a meaning that is consistent with their meaning in the context of the relevant art and the invention and will not be interpreted in an idealized or overly formal sense unless explicitly so defined herein.

FIG. 1 is a schematic view of an equivalent circuit of a photosensitive apparatus 10 according to an embodiment of the disclosure.

Figure 2:
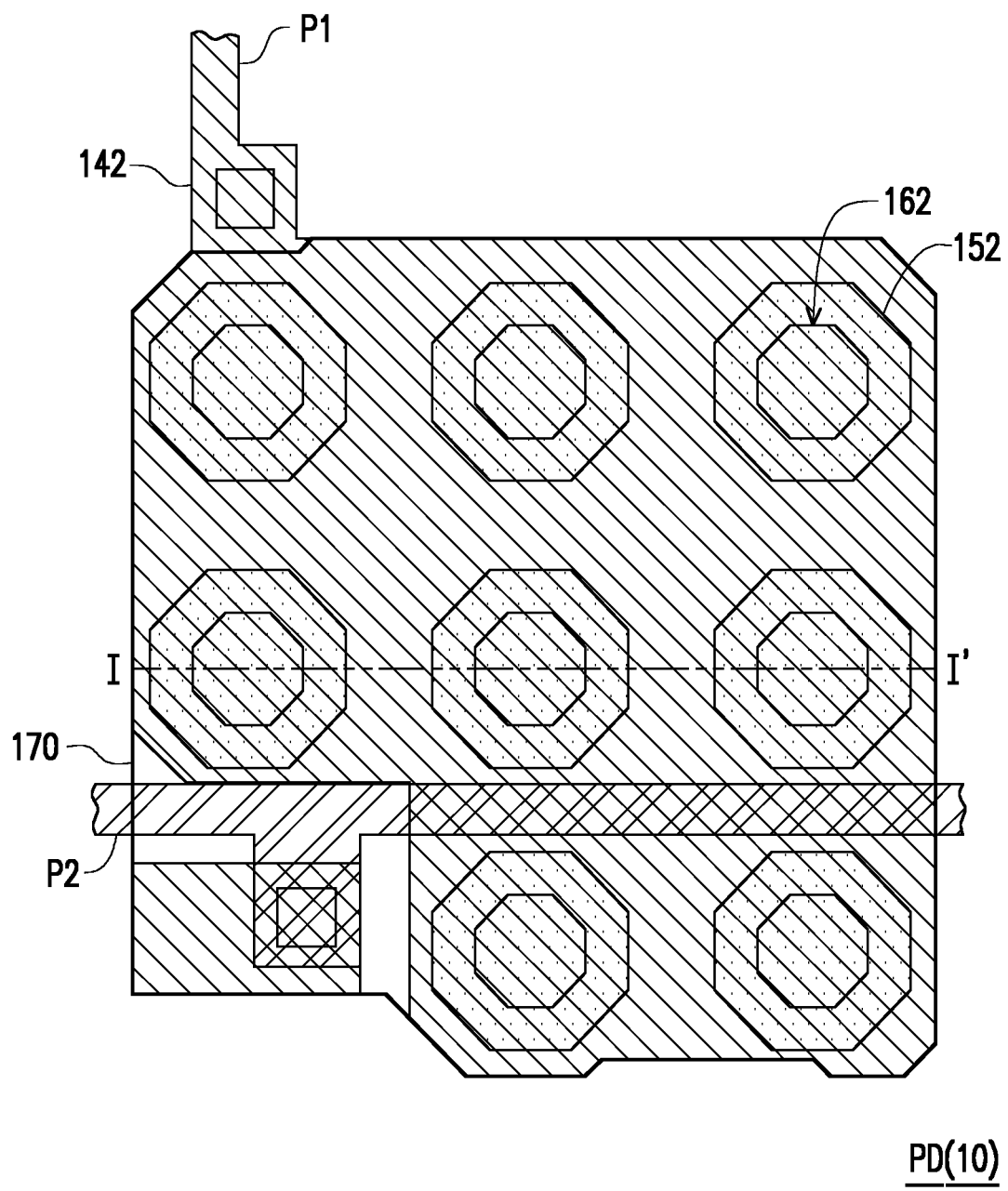
FIG. 2 is a schematic top view of a photosensitive element PD of the photosensitive apparatus 10 according to an embodiment of the disclosure.

FIG. 2 is a schematic top view of a photosensitive element PD of the photosensitive apparatus 10 according to an embodiment of the disclosure.

Figure 3:
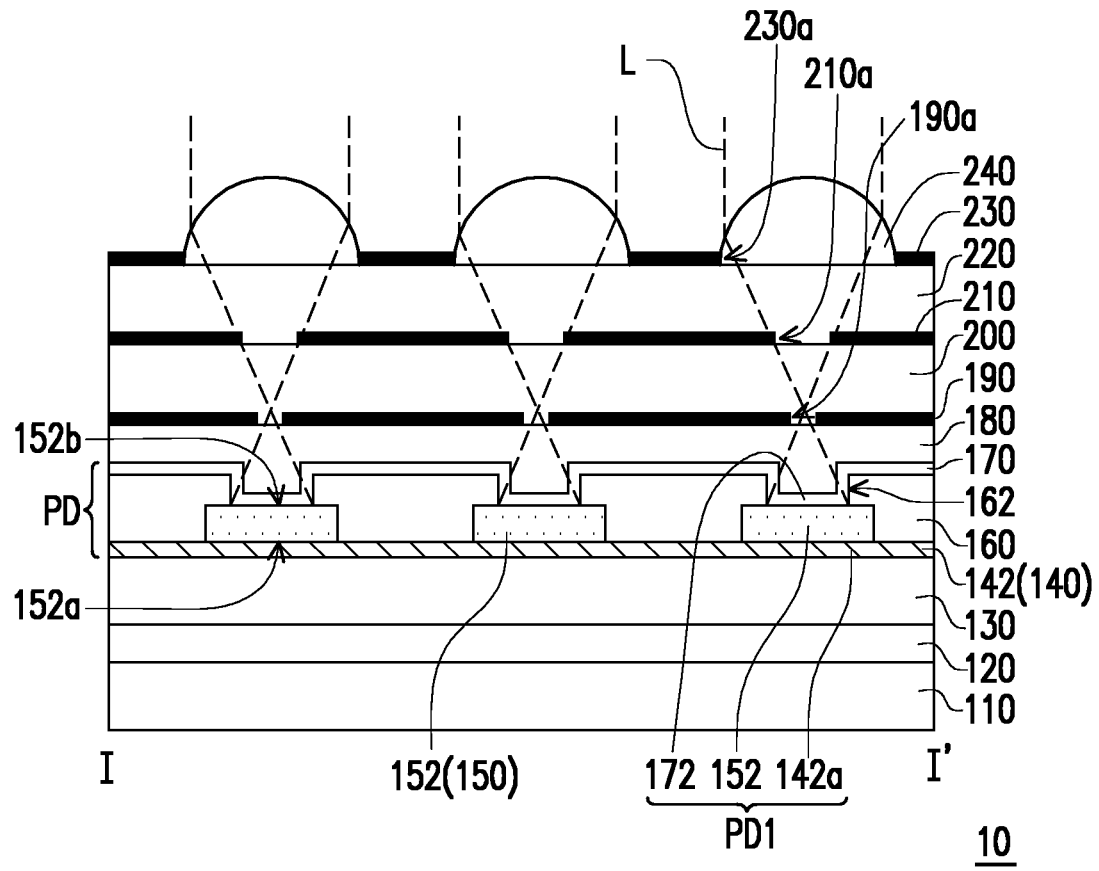
FIG. 3 is a schematic cross-sectional view of the photosensitive apparatus 10 according to an embodiment of the disclosure.

FIG. 3 is a schematic cross-sectional view of the photosensitive apparatus 10 according to an embodiment of the disclosure. FIG. 3 corresponds to section line I-I' of FIG. 2.

Figure 4:
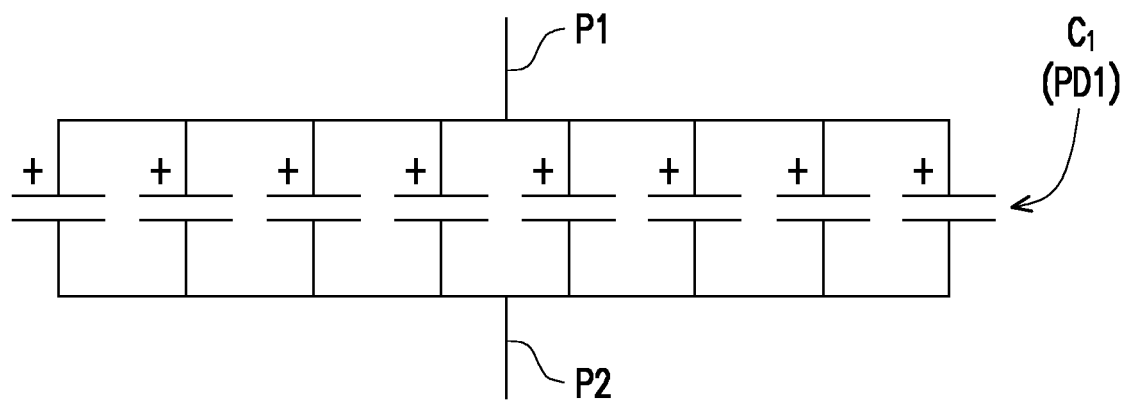
FIG. 4 shows a plurality of capacitors $C_1$ of a plurality of first sensor structures PD1 of the photosensitive element PD of FIG. 2.

FIG. 4 shows a plurality of capacitors $C_1$ of a plurality of first sensor structures PD1 of the photosensitive element PD of FIG. 2.

With reference to FIG. 3, the photosensitive apparatus 10 includes a substrate 110 for carrying other components of the photosensitive apparatus 10. In this embodiment, the material of the substrate 110 may include glass. Nonetheless, the disclosure is not limited thereto. In other embodiments, the material of the substrate 110 may also include quartz, organic polymers, opaque/reflective materials (e.g., wafers and ceramics), or other applicable materials.

With reference to FIG. 1 and FIG. 2, the photosensitive apparatus 10 further includes an operating circuit FPS. The operating circuit FPS is disposed on the substrate 110 and has a first terminal P1 and a second terminal P2. In this embodiment, the photosensitive apparatus 10 is configured to sense a light beam L (shown in FIG. 3) reflected by a fingerprint of a finger. In addition, the operating circuit FPS may also be referred to as a fingerprint identification circuit.

With reference to FIG. 1, for example, in this embodiment, the operating circuit FPS may include a pixel circuit $FPS_{PX}$, a reset circuit $FPS_{RST}$, an active load circuit $FPS_{LD}$, and a zone-switch circuit $FPS_{ZSW}$.

In this embodiment, the pixel circuit $FPS_{PX}$ may include a first transistor T1, a second transistor T2, a first reference voltage line (not shown) configured to provide a reference voltage VSS, a sensing scan line (not shown) configured to provide a read voltage SR_R, a power supply line (not shown) configured to provide a power supply voltage VDD, a signal line configured to provide an operating voltage SR_W, and a readout line (not shown) configured to transmit a readout signal $S_{out}$. A first terminal T1a of the first transistor T1 is electrically connected to the first reference voltage line configured to provide the reference voltage VSS. A control terminal T1c of the first transistor T1 is electrically connected to the sensing scan line configured to provide the read voltage SR_R. A second terminal T1b of the first transistor T1 is electrically connected to a control terminal T2c of the second transistor T2 and the photosensitive element PD. A first terminal T2a of the second transistor T2 is electrically connected to the power supply line configured to provide the power supply voltage VDD. Moreover, a second terminal T2b of the second transistor T2 is electrically connected to the readout line (not shown) configured to transmit the readout signal $S_{out}$.

In this embodiment, the reset circuit $FPS_{RST}$ may include a reset transistor T3, a reset signal line (not shown) configured to provide a reset signal RST, and a second reference voltage line (not shown) configured to provide a reference voltage Res_VSS. A first terminal T3a of the reset transistor T3 is electrically connected to the second reference voltage line configured to provide the reference voltage Res_VSS. A control terminal T3c of the reset transistor T3 is electrically connected to the reset signal line configured to provide the reset signal RST. Moreover, a second terminal T3b of the reset transistor T3 is electrically connected to the readout line (not shown) configured to transmit the readout signal $S_{out}$.

In this embodiment, the active load circuit $FPS_{LD}$ may include a load transistor T4 to form a resistor, a bias voltage signal line (not shown) configured to provide a bias voltage Vb, and a third reference voltage line (not shown) configured to provide a reference voltage Vb_VSS. A first terminal T4a of the load transistor T4 is electrically connected to the third reference voltage line configured to provide the reference voltage Vb_VSS. A control terminal T4c of the load transistor T4 is electrically connected to the bias voltage signal line configured to provide the bias voltage Vb. Moreover, a second terminal T4b of the load transistor T4 is electrically connected to the readout line (not shown) configured to transmit the readout signal $S_{out}$.

In this embodiment, the zone-switch circuit $FPS_{ZSW}$ may include a selection transistor T5, a selection line (not shown), and a bus line (not shown). A control terminal T5c of the selection transistor T5 is electrically connected to the selection line configured to provide a multiplex signal ZSW. A second terminal T5b of the selection transistor T5 is electrically connected to the readout line (not shown) configured to transmit the readout signal $S_{out}$. Moreover, a first terminal T5a of the selection transistor T5 is electrically connected to the bus line.

Note that, the form of the operating circuit FPS of the photosensitive apparatus 10 as mentioned above is used to only describe, but not limit, the disclosure. In other embodiments, the operating circuit FPS may also be in other forms.

With reference to FIG. 1 and FIG. 2, the first terminal P1 of the operating circuit FPS is electrically connected to the first reference voltage line (not shown) configured to provide the reference voltage VSS, and the second terminal P2 of the operating circuit FPS is electrically connected to the signal line (not shown) configured to provide the operating voltage SR_W. With reference to FIG. 1, for example, in this embodiment, the first terminal P1 of the operating circuit FPS may refer to a location directly electrically connected to the second terminal T1b of the first transistor T1 and the control terminal T2c of the second transistor T2, and the second terminal P2 of the operating circuit FPS may refer to a location directly electrically connected to the signal line configured to provide the operating voltage SR_W. Nonetheless, the disclosure is not limited thereto.

With reference to FIG. 1, FIG. 2 and FIG. 3, the photosensitive apparatus 10 further includes the photosensitive element PD, which is electrically connected to the operating circuit FPS. With reference to FIG. 2 and FIG. 3, the photosensitive element PD includes a first electrode 142, a plurality of first photosensitive patterns 152, a dielectric layer 160, and a second electrode 170. The first electrode 142 is disposed on the substrate 110 and is electrically connected to the first terminal P1 of the operating circuit FPS (drawn in FIG. 1). The plurality of first photosensitive patterns 152 are separated from each other and are disposed on the first electrode 142. Each of the first photosensitive patterns 152 has a first surface 152a and a second surface 152b. The first surfaces 152a of the first photosensitive patterns 152 are electrically connected to the first electrode 142. The dielectric layer 160 is disposed on the first photosensitive patterns 152 and has a plurality of first contact holes 162. Moreover, the second electrode 170 is disposed on the dielectric layer 160 and is electrically connected to the second surfaces 152b of the first photosensitive patterns 152 through the first contact holes 162 of the dielectric layer 160.

With reference to FIG. 3, in this embodiment, the first electrode 142 of the photosensitive element PD is disposed below the rear surface (i.e., the first surface 152a) of the first photosensitive pattern 152. The first electrode 142 may be a reflective electrode. For example, in this embodiment, the material of the first electrode 142 may include metals, for example but not limited to, chromium, gold, silver, copper, tin, lead, hafnium, tungsten, molybdenum, neodymium, titanium, tantalum, aluminum, zinc.

In this embodiment, the material of the first photosensitive pattern 152 may include silicon-rich oxide (SRO), but the disclosure is not limited thereto.

The dielectric layer 160 may also be referred to as a planarization layer. In this embodiment, the material of the dielectric layer 160 may be an inorganic material (e.g., silicon oxide, silicon nitride, silicon oxynitride, or a stacked layer of at least two of the above materials), an organic material, or a combination of the above.

In this embodiment, the second electrode 170 of the photosensitive element PD is disposed on the light-receiving surface (i.e., the second surface 152b) of the first photosensitive pattern 152. In addition, the second electrode 170 is a light-transmitting electrode. For example, in this embodiment, the material of the second electrode 170 may include metal oxides, for example but not limited to, indium tin oxide, indium zinc oxide, aluminum tin oxide, aluminum zinc oxide, indium germanium zinc oxide, other suitable oxides, or a stacked layer of at least two of the above.

With reference to FIG. 3, in this embodiment, the photosensitive apparatus 10 includes an element layer 120 and an interlayer dielectric layer 130. The element layer 120, the interlayer dielectric layer 130, and a conductive layer 140 to which the first electrode 142 belongs are sequentially stacked on the substrate 110. With reference to FIG. 1 and FIG. 3, in this embodiment, the operating circuit FPS may be selectively formed in the element layer 120, the interlayer dielectric layer 130, and the conductive layer 140 to which the first electrode 142 belongs. Nonetheless, the disclosure is not limited thereto. According to other embodiments, the operating circuit FPS may also be formed in other film layers. The disclosure is not intended to limit the film layer where the operating circuit FPS is formed and its location.

With reference to FIG. 3, the photosensitive apparatus 10 further includes a spacer layer 180, a light shielding layer 190, and at least one micro lens 240. The spacer layer 180 is disposed on the second electrode 170. The light shielding layer 190 is disposed on the spacer layer 180, and has a plurality of light transmission openings 190a respectively corresponding to the first photosensitive patterns 152. The at least one micro lens 240 is disposed above the light shielding layer 190 and is overlapped with the light transmission openings 190a of the light shielding layer 190.

For example, in this embodiment, the photosensitive apparatus 10 may include a plurality of micro lenses 240, and each micro lens 240 may be overlapped with one corresponding light transmission opening 190a. Nonetheless, the disclosure is not limited thereto. According to other embodiments, the micro lens 240 may also be overlapped with multiple light transmission openings 190a.

In addition, in this embodiment, the photosensitive apparatus 10 may selectively include other spacer layers 200 and 220 and other light shielding layers 210 and 230. The spacer layers 180, 200, 220 and the light shielding layers 190, 210, 230 are alternately stacked on the photosensitive element PD. The light shielding layers 210 and 230 also have a plurality of light transmission openings 210a and 230a, and the plurality of light transmission openings 190a, 210a, 230a of the light shielding layers 190, 210, 230 are overlapped to form a plurality of light passages. The spacer layers 180, 200, 220 and the light shielding layers 190, 210, 230 may be regarded as a light collimator of the photosensitive apparatus 10, and the light collimator is configured to reduce the probability that the light beam L with a large incident angle enters the photosensitive element PD, thereby improving imaging quality.

With reference to FIG. 1, FIG. 2 and FIG. 3, in this embodiment, the second electrode 170 of the photosensitive element PD may be electrically connected to the second terminal P2 of the operating circuit FPS.

With reference to FIG. 2 and FIG. 3, in this embodiment, the first electrode 142 has a plurality of first portions 142a, and the second electrode 170 has a plurality of first portions 172. The first portions 142a of the first electrode 142, the first portions 172 of the second electrode 170, and the first photosensitive patterns 152 form the first sensor structures PD1. Each of the first sensor structures PD1 includes one first portion 142a of the first electrode 142, one first photosensitive pattern 152, and one first portion 172 of the second electrode 170 sequentially stacked. The first portions 142a of the first electrode 142 are directly connected and have the same electric potential. The first portions 172 of the second electrode 170 are directly connected and have the same electric potential. In other words, the first sensor structures PD1 of the photosensitive element PD are connected in parallel.

With reference to FIG. 2, FIG. 3, and FIG. 4, in this embodiment, the photosensitive element PD may be formed with an n number of first sensor structures PD1 connected in parallel, where n is a positive integer greater than or equal to 2. The capacitor of each first sensor structure PD1 is $C_1$, and the equivalent capacitor of the photosensitive element PD is substantially equal to $nC_1$.

For example, in this embodiment, the number of first sensor structures PD1 of the photosensitive element PD is 8 (i.e., n=8), and the equivalent capacitor of the photosensitive element PD is substantially equal to $8C_1$. Note that, the disclosure is not intended to limit that the number of first sensor structures PD1 included in the photosensitive element PD is necessarily 8. In other embodiments, the photosensitive element PD may also include other numbers of first sensor structures PD1.

Notably, in this embodiment, the first photosensitive patterns 152 configured to receive the light beam L are separated from each other. In other words, in a photosensitive layer 150 of the photosensitive element PD, the light-receiving area for the light beam L and the process variation area in a proximity thereto are retained while other areas are removed. Accordingly, the ratio of the light-receiving area of the photosensitive element PD to the equivalent capacitor of the photosensitive element PD is increased, and photosensitivity of the photosensitive apparatus 10 is increased.

Note that, the reference numerals and part of contents of the embodiments above remain to be used in the embodiments below, where the same or similar elements are denoted with the same reference numerals, and description of the same technical content is omitted. Reference may be made to the embodiments above for the description of the omitted parts, which will not be repeated in the embodiments below.

Figure 5:
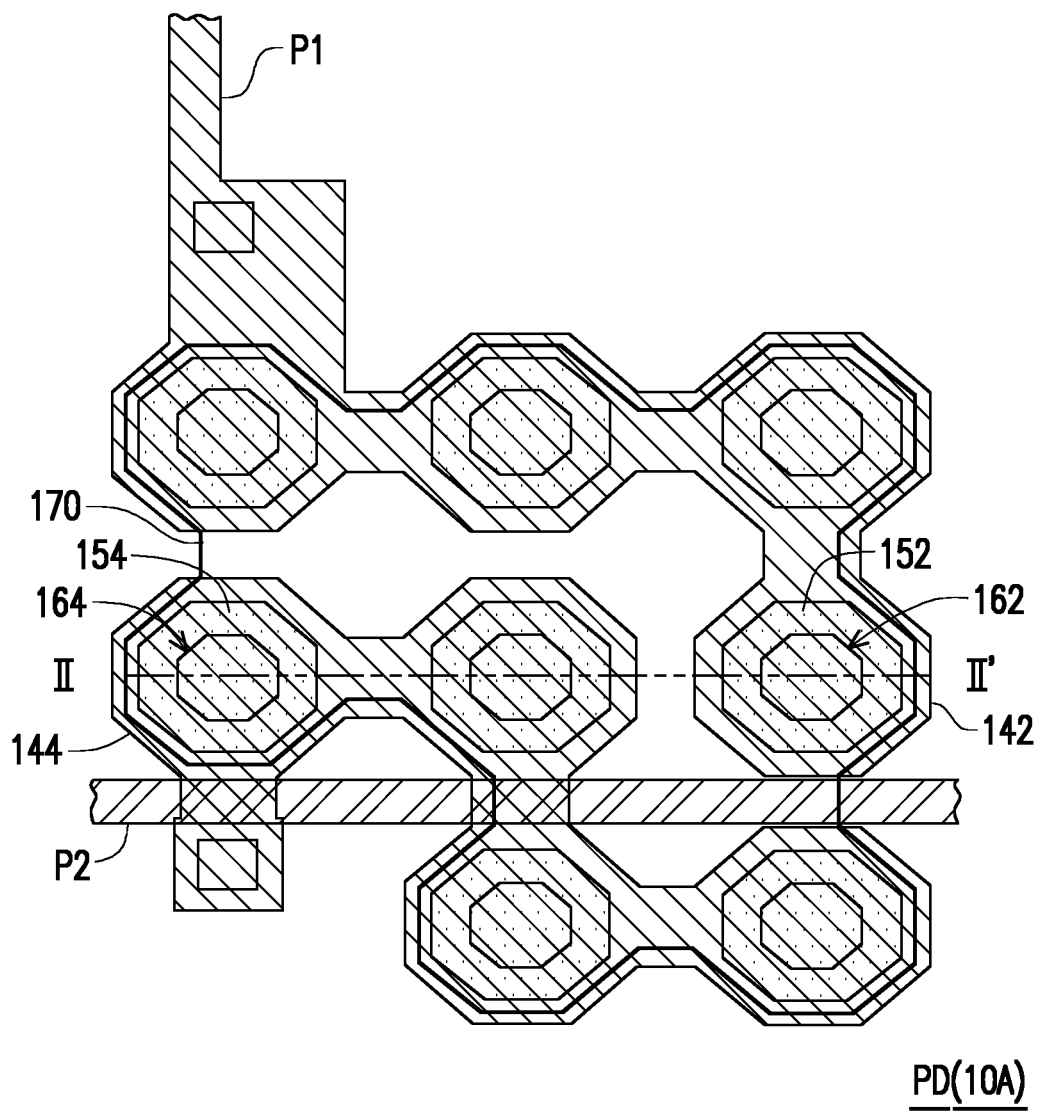
FIG. 5 is a schematic top view of the photosensitive element PD of a photosensitive apparatus 10A according to an embodiment of the disclosure.

FIG. 5 is a schematic top view of the photosensitive element PD of a photosensitive apparatus 10A according to an embodiment of the disclosure.

Figure 6:
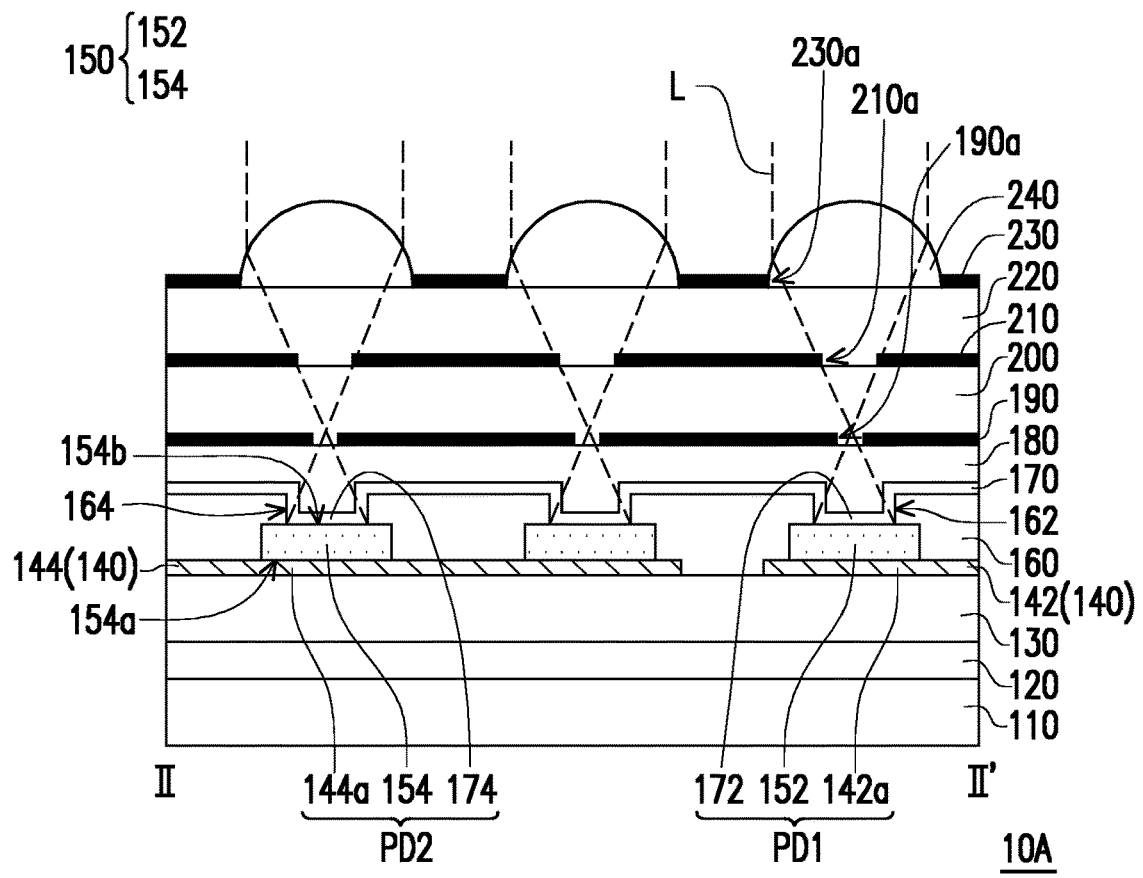
FIG. 6 is a schematic cross-sectional view of the photosensitive apparatus 10A according to an embodiment of the disclosure.

FIG. 6 is a schematic cross-sectional view of the photosensitive apparatus 10A according to an embodiment of the disclosure. FIG. 6 corresponds to section line II-II' of FIG. 5.

Figure 7:
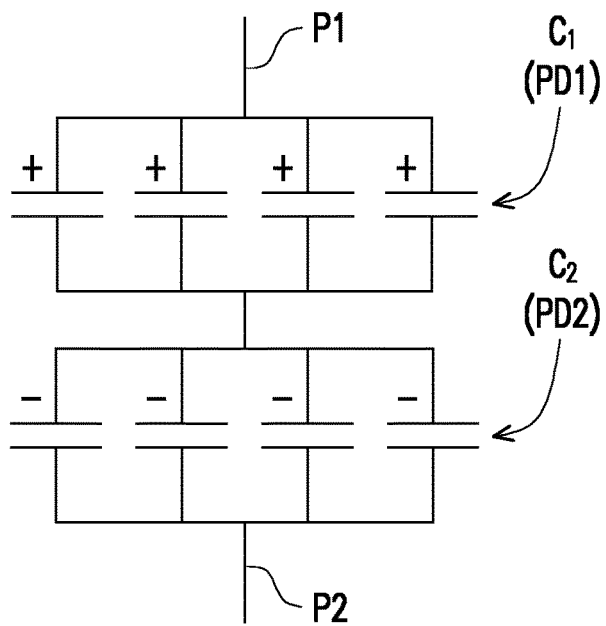
FIG. 7 shows the plurality of capacitors $C_1$ of the plurality of first sensor structures PD1 and a plurality of capacitors $C_2$ of a plurality of second sensor structures PD2 of the photosensitive element PD of FIG. 5.

FIG. 7 shows the plurality of capacitors $C_1$ of the plurality of first sensor structures PD1 and a plurality of capacitors $C_2$ of a plurality of second sensor structures PD2 of the photosensitive element PD of FIG. 5.

The photosensitive apparatus 10A of this embodiment is similar to the photosensitive apparatus 10, and the difference between the two lies in that: the photosensitive element PD of the photosensitive apparatus 10A is different from the photosensitive element PD of the photosensitive apparatus 10.

With reference to FIG. 5 and FIG. 6, similarly, in this embodiment, the first electrode 142 is electrically connected to the first terminal P1 of the operating circuit FPS (reference may be made to FIG. 1). The first electrode 142 has a plurality of first portions 142a, and the second electrode 170 has a plurality of first portions 172. The first portions 142a of the first electrode 142, the first portions 172 of the second electrode 170, and the first photosensitive patterns 152 form the first sensor structures PD1. Each of the first sensor structures PD1 includes one first portion 142a of the first electrode 142, one first photosensitive pattern 152, and one first portion 172 of the second electrode 170 sequentially stacked. The first portions 142a of the first electrode 142 are directly connected and have the same electric potential. The first portions 172 of the second electrode 170 are directly connected and have the same electric potential. In other words, the first sensor structures PD1 of the photosensitive element PD are connected in parallel.

Different from the photosensitive apparatus 10, in this embodiment, the photosensitive element PD of the photosensitive apparatus 10A further includes a third electrode 144 and a plurality of second photosensitive patterns 154. The third electrodes 144 are disposed on the substrate 110 and are separated from the first electrode 142. The third electrodes 144 are electrically connected to the second terminal P2 of the operating circuit FPS (reference may be made to FIG. 1). The second photosensitive patterns 154 are separated from each other and are disposed on the third electrode 144. Each of the second photosensitive patterns 154 has a first surface 154a and a second surface 154b. The first surfaces 154a of the second photosensitive patterns 154 are electrically connected to the third electrode 144. The dielectric layer 160 is further disposed on the second photosensitive patterns 154, and further has a plurality of second contact holes 164. The second electrode 170 is further electrically connected to the second surfaces 154b of the second photosensitive patterns 154 through the second contact holes 164 of the dielectric layer 160.

In this embodiment, the third electrode 144 has a plurality of first portions 144a, and the second electrode 170 further has a plurality of second portions 174. The first portions 144a of the third electrode 144, the second portions 174 of the second electrode 170, and the second photosensitive patterns 154 form the second sensor structures PD2. Each of the second sensor structures PD2 includes one first portion 144a of the third electrode 144, one second photosensitive pattern 154, and one second portion 174 of the second electrode 170 sequentially stacked. The first portions 144a of the third electrode 144 are directly connected and have the same electric potential. The second portions 174 of the second electrode 170 are directly connected and have the same electric potential. In other words, the second sensor structures PD2 of the photosensitive element PD are connected in parallel.

With reference to FIG. 5, FIG. 6, and FIG. 7, the first portions 142a of the first electrode 142 of the first sensor structures PD1 are electrically connected to the first terminal P1 of the operating circuit FPS (reference may be made to FIG. 1). The first portions 172 and the second portions 174 of the second electrode 170 of the first sensor structures PD1 are directly connected and have the same electric potential. The first portions 144a of the third electrode 144 of the second sensor structures PD2 are electrically connected to the second terminal P2 of the operating circuit FPS (reference may be made to FIG. 1). In other words, the first sensor structures PD1 connected in parallel with each other are connected in series with the second sensor structures PD2 connected in parallel with each other.

In this embodiment, the photosensitive element PD is formed with a p number of first sensor structures PD1 and a q number of second sensor structures PD2, where the p number of first sensor structures PD1 are connected in parallel with each other, the p number of first sensor structures PD1 and the q number of second sensor structures PD2 are connected in series, p is a positive integer greater than or equal to 2, and q is a positive integer greater than or equal to 1. When q is a positive integer greater than or equal to 2, the q number of second sensor structures PD2 are connected in parallel with each other, and the p number of first sensor structures PD1 connected in parallel with each other are connected in series with the q number of second sensor structures PD2 connected in parallel with each other.

In this embodiment, the equivalent capacitor of the photosensitive element PD is substantially equal to $1/[(1/pC_1)+(1/qC_2)]$, where the capacitor of each first sensor structure PD1 is $C_1$, and the capacitor of each second sensor structure PD2 is $C_2$.

For example, in this embodiment, the number of first sensor structures PD1 of the photosensitive element PD is 4 (i.e., p=4), the number of second sensor structures PD2 of the photosensitive element PD is 4 (i.e., q=4), $C_1=C_2$, and the equivalent capacitor of the photosensitive element PD is substantially equal to $2C_1$.

Notably, in this embodiment, by connecting the first sensor structures PD1 connected in parallel with each other with the at least one second sensor structures PD2 in series, the equivalent capacitor of the photosensitive element PD is further reduced, and photosensitivity of the photosensitive apparatus 10A is significantly increased.

Besides, in this embodiment, the number q of the second sensor structures PD2 of the photosensitive element PD is a positive integer greater than or equal to 2 (e.g., 4). Nonetheless, the disclosure is not limited thereto. In another embodiment not shown, the number q of the second sensor structures PD2 of the photosensitive element PD may also be 1.

In addition, in this embodiment, the number of first sensor structures PD1 of the photosensitive element PD may be the same as the number of second sensor structures PD2. Nonetheless, the disclosure is not limited thereto. In other embodiments, in the photosensitive element PD, the number of first sensor structures PD1 may also be different from the number of second sensor structures PD2, examples of which accompanied with FIG. 8, FIG. 9, FIG. 10 and FIG. 11 will be described below.

Figure 8:
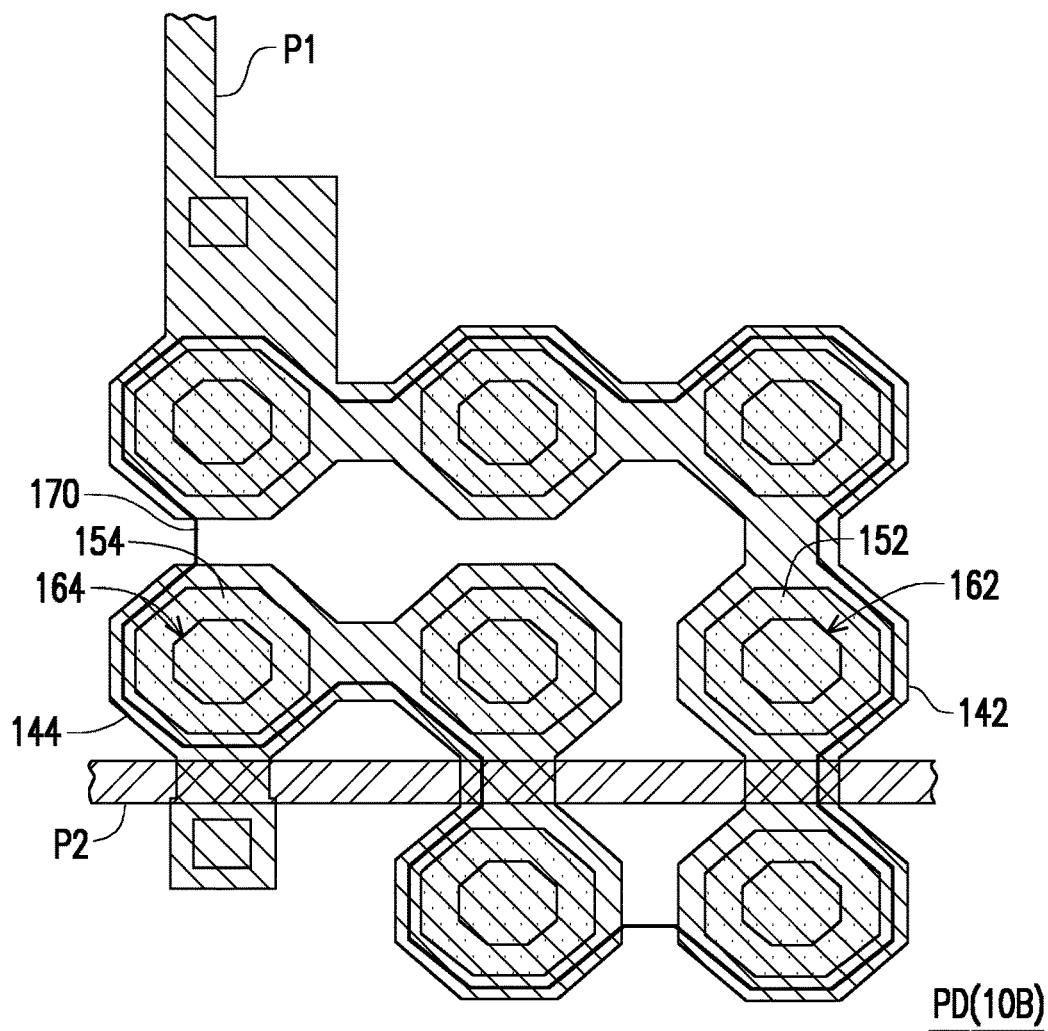
FIG. 8 is a schematic top view of the photosensitive element PD of a photosensitive apparatus 10B according to an embodiment of the disclosure.

FIG. 8 is a schematic top view of the photosensitive element PD of a photosensitive apparatus 10B according to an embodiment of the disclosure.

Figure 9:
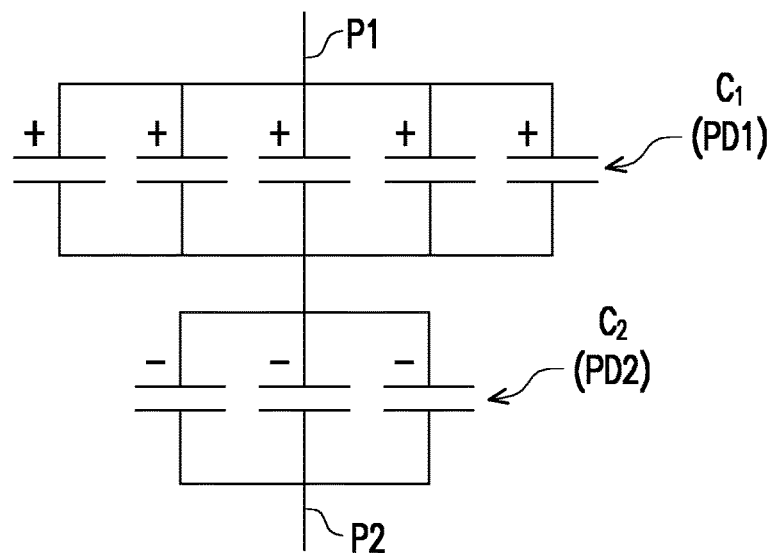
FIG. 9 shows the plurality of capacitors $C_1$ of the plurality of first sensor structures PD1 and the plurality of capacitors $C_2$ of the plurality of second sensor structures PD2 of the photosensitive element PD of FIG. 8.

FIG. 9 shows the plurality of capacitors $C_1$ of the plurality of first sensor structures PD1 and the plurality of capacitors $C_2$ of the plurality of second sensor structures PD2 of the photosensitive element PD of FIG. 8.

The photosensitive apparatus 10B of this embodiment is similar to the photosensitive apparatus 10A, and the difference between the two lies in that: in the photosensitive element PD of the photosensitive apparatus 10B, the number of first sensor structures PD1 is different from the number of second sensor structures PD2.

With reference to FIG. 8 and FIG. 9, specifically, in this embodiment, the number of first sensor structures PD1 of the photosensitive element PD may be greater than the number of second sensor structures PD2. For example, in this embodiment, the number of first sensor structures PD1 of the photosensitive element PD is 5, the number of second sensor structures PD2 of the photosensitive element PD is 3, the capacitor of each first sensor structure PD1 is $C_1$, the capacitor of each second sensor structure PD2 is $C_2$, $C_1=C_2$, and the equivalent capacitor of the photosensitive element PD is substantially equal to 1.875 $C_1$.

Notably, the first sensor structures PD1 and the second sensor structures PD2 have different electrical properties (e.g., the two have different voltage-dark current characteristic curves). By adjusting the number of first sensor structures PD1 and the number of second sensor structures PD2 of the photosensitive element PD, the photoelectric property of the photosensitive element PD may be changed to further meet actual requirements.

Figure 10:
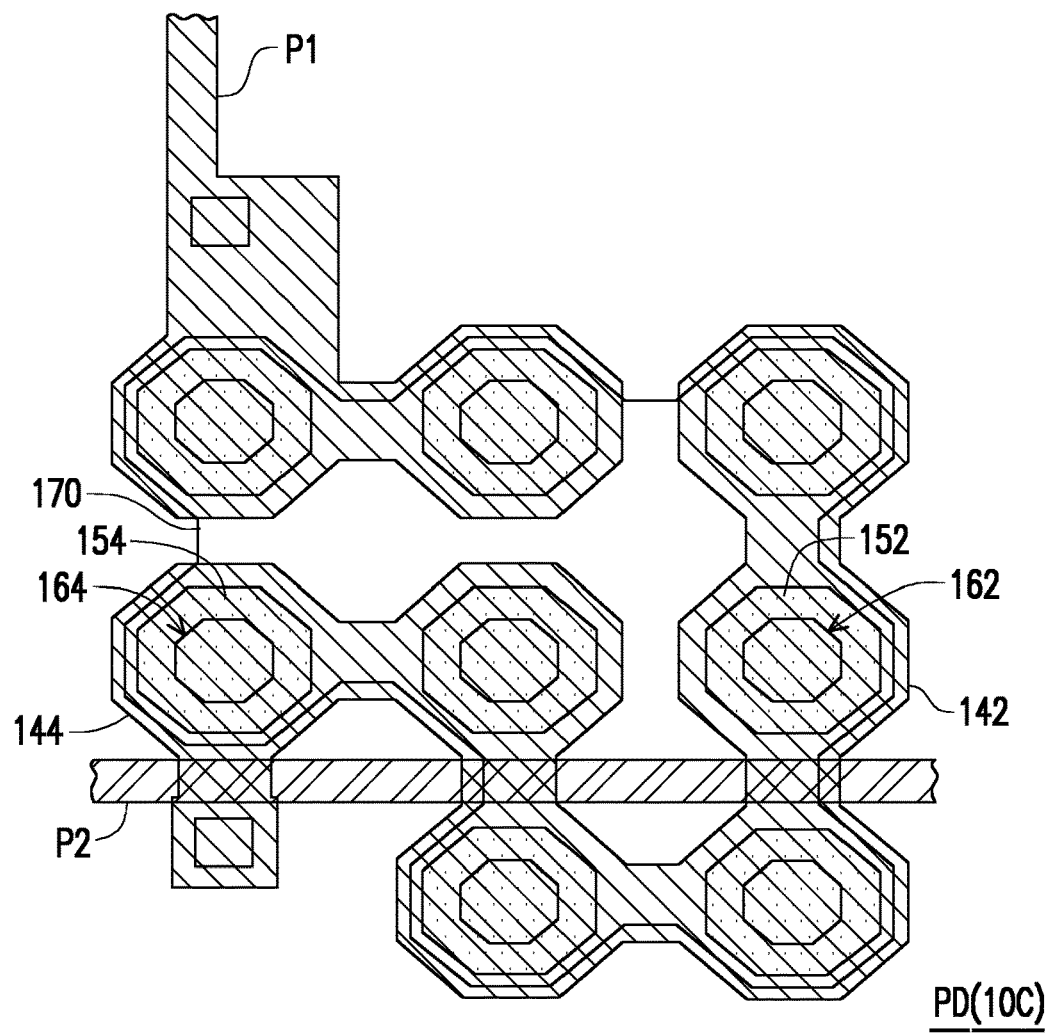
FIG. 10 is a schematic top view of the photosensitive element PD of a photosensitive apparatus 10C according to an embodiment of the disclosure.

FIG. 10 is a schematic top view of the photosensitive element PD of a photosensitive apparatus 10C according to an embodiment of the disclosure.

Figure 11:
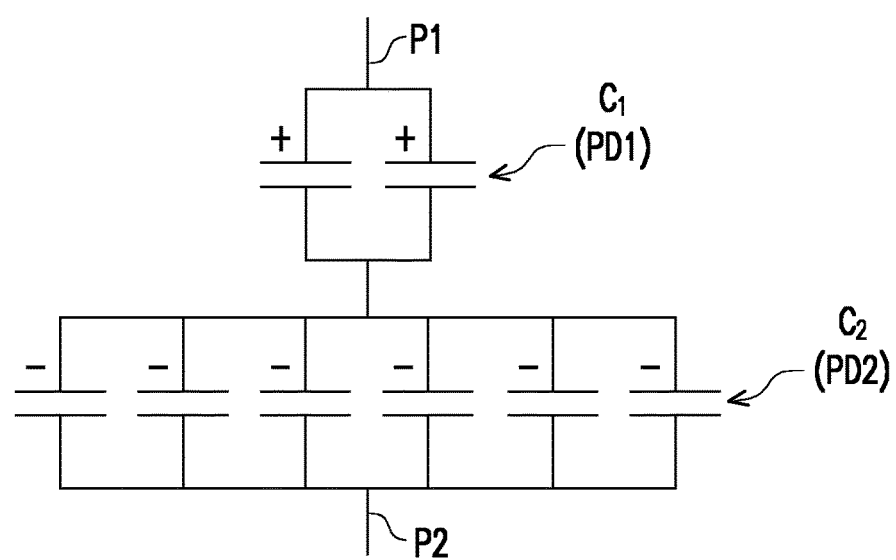
FIG. 11 shows the plurality of capacitors $C_1$ of the plurality of first sensor structures PD1 and the plurality of capacitors $C_2$ of the plurality of second sensor structures PD2 of the photosensitive element PD of FIG. 10.

FIG. 11 shows the plurality of capacitors $C_1$ of the plurality of first sensor structures PD1 and the plurality of capacitors $C_2$ of the plurality of second sensor structures PD2 of the photosensitive element PD of FIG. 10.

The photosensitive apparatus 10C of this embodiment is similar to the photosensitive apparatus 10A, and the difference between the two lies in that: in the photosensitive element PD of the photosensitive apparatus 10C, the number of first sensor structures PD1 is different from the number of second sensor structures PD2.

With reference to FIG. 10 and FIG. 11, specifically, in this embodiment, the number of first sensor structures PD1 of the photosensitive element PD may be less than the number of second sensor structures PD2. For example, in this embodiment, the number of first sensor structures PD1 of the photosensitive element PD is 2, the number of second sensor structures PD2 of the photosensitive element PD is 6, the capacitor of each first sensor structure PD1 is $C_1$, the capacitor of each second sensor structure PD2 is $C_2$, $C_1=C_2$, and the equivalent capacitor of the photosensitive element PD is substantially equal to 1.5 $C_1$.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A photosensitive apparatus, comprising:
    a substrate;
    an operating circuit disposed on the substrate and having a first terminal and a second terminal;
    a first electrode disposed on the substrate and electrically connected to the first terminal of the operating circuit;
    a plurality of first photosensitive patterns separated from each other and disposed on the first electrode, wherein each of the first photosensitive patterns has a first surface and a second surface, and the plurality of first surfaces of the first photosensitive patterns are electrically connected to the first electrode;
    a dielectric layer disposed on the first photosensitive patterns and having a plurality of first contact holes;
    a second electrode disposed on the dielectric layer and electrically connected to the plurality of second surfaces of the first photosensitive patterns through the first contact holes of the dielectric layer;
    a spacer layer disposed on the second electrode;
    a light shielding layer disposed on the spacer layer and having a plurality of light transmission openings corresponding to the first photosensitive patterns; and
    at least one micro lens disposed above the light shielding layer and overlapped with the light transmission openings of the light shielding layer.

2. The photosensitive apparatus according to claim 1, wherein the second electrode is electrically connected to the second terminal of the operating circuit.

3. The photosensitive apparatus according to claim 1, wherein the first electrode has a plurality of first portions in direct connection, and the second electrode has a plurality of first portions in direct connection; the first portions of the first electrode, the first portions of the second electrode, and the first photosensitive patterns form a plurality of first sensor structures; each of the first sensor structures comprises one first portion of the first electrode, one first photosensitive pattern, and one first portion of the second electrode sequentially stacked; and the first sensor structures are connected in parallel.

4. The photosensitive apparatus according to claim 1, further comprising:
    a third electrode disposed on the substrate, separated from the first electrode, and electrically connected to the second terminal of the operating circuit; and
    at least one second photosensitive pattern disposed on the third electrode, wherein the at least one second photosensitive pattern has a first surface and a second surface, and the first surface of the at least one second photosensitive pattern is electrically connected to the third electrode;

the dielectric layer is further disposed on the at least one second photosensitive pattern and further has at least one second contact hole; and the second electrode is further electrically connected to the second surface of the at least one second photosensitive pattern through the at least one second contact hole of the dielectric layer.

5. The photosensitive apparatus according to claim 4, wherein the first electrode has a plurality of first portions in direct connection, and the second electrode has a plurality of first portions in direct connection; the first portions of the first electrode, the first portions of the second electrode, and the first photosensitive patterns form a plurality of first sensor structures; each of the first sensor structures comprises one first portion of the first electrode, one first photosensitive pattern, and one first portion of the second electrode sequentially stacked; and the first sensor structures are connected in parallel.

6. The photosensitive apparatus according to claim 5, wherein the third electrode has at least one first portion, and the second electrode further has at least one second portion; the at least one first portion of the third electrode, the at least one second portion of the second electrode, and the at least one second photosensitive pattern form at least one second sensor structure; and the first sensor structures connected in parallel are connected in series with the at least one second sensor structure.

7. The photosensitive apparatus according to claim 6, wherein the at least one second sensor structure comprises a plurality of second sensor structures; the at least one second photosensitive pattern comprises a plurality of second photosensitive patterns separated from each other; the at least one first portion of the third electrode comprises a plurality of first portions in direct connection; the at least one second portion of the second electrode comprises a plurality of second portions in direct connection; the first portions of the third electrode, the second portions of the second electrode, and the second photosensitive patterns form the second sensor structures;

each of the second sensor structures comprises one of the first portions of the third electrode, one of the second photosensitive patterns, and one of the second portions of the second electrode sequentially stacked; and the second sensor structures are connected in parallel.

8. The photosensitive apparatus according to claim 6, wherein the number of first sensor structures is the same as the number of the second sensor structures.

9. The photosensitive apparatus according to claim 6, wherein the number of first sensor structures is different from the number of the second sensor structures.

* * * * *